(12) United States Patent
Welch et al.

(10) Patent No.: US 7,734,191 B1
(45) Date of Patent: Jun. 8, 2010

(54) FORWARD ERROR CORRECTION (FEC) ENABLED PHOTONIC INTEGRATED CIRCUIT (PICS) CHIPS WITH MULTIPLE SIGNAL CHANNELS

(75) Inventors: David F. Welch, Menlo Park, CA (US); Drew D. Perkins, Saratoga, CA (US); Fred A. Kish, Jr., Palo Alto, CA (US); Ting-Kuang Chiang, Saratoga, CA (US)

(73) Assignee: Infinera Corporation, Sunnyvale, CA (US)

( * ) Notice: Subject to any disclaimer, the term of this patent is extended or adjusted under 35 U.S.C. 154(b) by 624 days.

(21) Appl. No.: 11/609,331

(22) Filed: Dec. 11, 2006

Related U.S. Application Data

(63) Continuation-in-part of application No. 10/267,304, filed on Oct. 8, 2002, now Pat. No. 7,116,851, and a continuation-in-part of application No. 10/712,732, filed on Nov. 12, 2003.

(60) Provisional application No. 60/748,989, filed on Dec. 9, 2005.

(51) Int. Cl.
*H04B 10/00* (2006.01)
*H04B 10/04* (2006.01)
*H04B 10/08* (2006.01)

(52) U.S. Cl. ............... 398/192; 398/25; 398/158

(58) Field of Classification Search ............ 398/25–27, 398/158, 164, 192–195
See application file for complete search history.

(56) References Cited

U.S. PATENT DOCUMENTS

| | | | |
|---|---|---|---|
| 6,433,904 B1 | 8/2002 | Swanson et al. | |
| 6,683,855 B1 | 1/2004 | Bordogna et al. | |
| 6,742,154 B1 | 5/2004 | Barnard | |
| 6,775,799 B1 | 8/2004 | Giorgetta et al. | |
| 6,836,485 B1 | 12/2004 | Bendak et al. | |
| 7,099,597 B2 * | 8/2006 | Saunders et al. | 398/193 |
| 7,113,667 B2 | 9/2006 | Welch et al. | |
| 7,116,851 B2 | 10/2006 | Welch et al. | |
| 7,197,245 B1 * | 3/2007 | Islam et al. | 398/82 |

(Continued)

FOREIGN PATENT DOCUMENTS

WO     0108422 A2     2/2001

OTHER PUBLICATIONS

Denis Penninckx et a., WDM redundancy to counteract PMD effects in optical systems, Proc. 27th Eur. Conf. on Opt. Comm. (ECOC '01—Amsterdam), 2001, pp. 444-445.

*Primary Examiner*—Dalzid Singh
(74) *Attorney, Agent, or Firm*—W. Douglas Carothers, Jr.; Ross M. Carothers

(57) ABSTRACT

A forward error correction (FEC) communication device that includes a transmitter photonic integrated circuit (TxPIC) or a receiver photonic integrated circuit (RxPIC) and a FEC device for FEC coding at least one channel with a first error rate and at least one additional channel with a second error rate, wherein the first error rate is greater than the second error rate. The TxPIC chip is a monolithic multi-channel chip having an array of modulated sources integrated on the chip, each operating at a different wavelength, wherein at least one of the modulated sources is modulated with a respective FEC encoded signal. The TxPIC also includes an integrated wavelength selective combiner for combining the channels for transport over an optical link.

9 Claims, 11 Drawing Sheets

U.S. PATENT DOCUMENTS

| | | |
|---|---|---|
| 2002/0053062 A1 | 5/2002 | Szmanski |
| 2002/0063934 A1* | 5/2002 | Sakauchi ................ 359/173 |
| 2002/0178417 A1 | 11/2002 | Jacob et al. |
| 2003/0025971 A1* | 2/2003 | Price et al. ............. 359/181 |
| 2003/0095737 A1 | 5/2003 | Welch et al. |
| 2004/0096213 A1 | 5/2004 | Perkins et al. |
| 2004/0218919 A1 | 11/2004 | Hunsche et al. |
| 2006/0008279 A1 | 1/2006 | Chiang et al. |

* cited by examiner

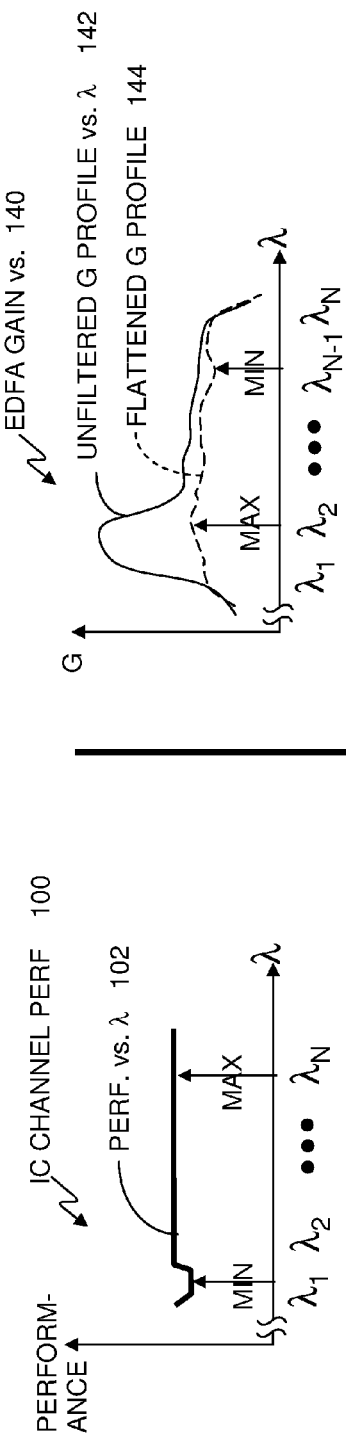
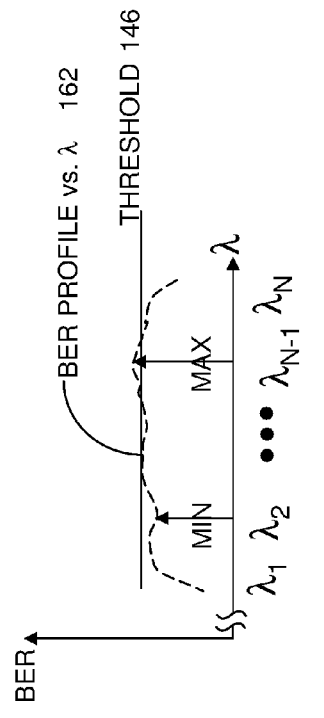
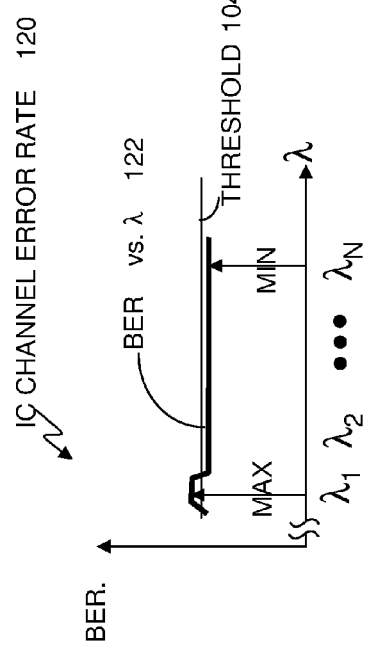
FIG. 1A
FIG. 1B
FIG. 1C
FIG. 1D

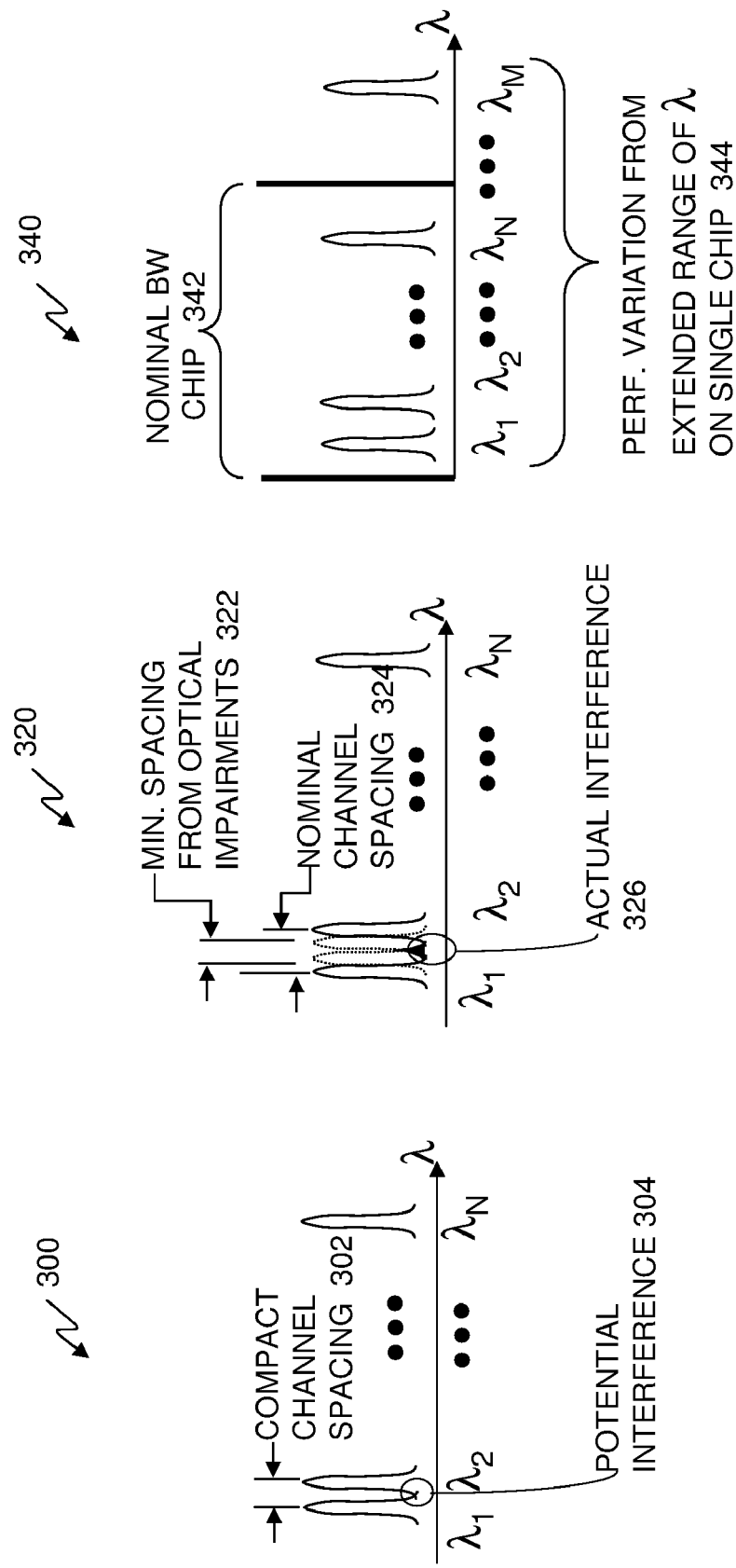

FORWARD ERROR CORRECTION (FEC) ENABLED PHOTONIC INTEGRATED CIRCUIT (PICS) CHIPS WITH MULTIPLE SIGNAL CHANNELS

REFERENCE TO RELATED APPLICATION

This application is a continuation-in-part of parent U.S. Pat. No. 7,116,851 entitled An Optical Signal Receiver Photonic Integrated Circuit (RxPIC), AN ASSOCIATED OPTICAL SIGNAL TRANSMITTER PHOTONIC INTEGRATED CIRCUIT (TXPIC) AND AN OPTICAL TRANSPORT NETWORK UTILIZING THESE CIRCUITS, issued Oct. 3, 2006; and is a continuation in part of Ser. No. 10/712,732, entitled METHOD AND APPARATUS FOR DEPLOYING FORWARD ERROR CORRECTION (FEC) IN OPTICAL TRANSMISSION NETWORKS AND THE DEPLOYMENT OF PHOTONIC INTEGRATED CIRCUIT (PIC) CHIPS WITH THE SAME, filed Nov. 12, 2003, both owned by the common assignee herein, which applications are incorporated herein by their reference. This application claims priority to U.S. provisional application Ser. No. 60/748,989, filed Dec. 9, 2005, owned by the common assignee herein, which application is incorporated herein by its reference.

BACKGROUND OF THE INVENTION

1. Field of the Invention

This invention relates generally to optimization of optical communication networks and more particularly to the deployment of forward error correction (FEC) for optimization of parameters in the operation of photonic integrated circuits (PICs) in optical transmitters as depicted, for example, in FIG. 70 of the above identified parent application.

2. Description of the Related Art

It is an expectation for optical communication systems in optical transport networks to operate at a low bit error rate (BER), such as, $10^{-12}$ and lower. In the past, when the demands on such systems was slower due, for example, to larger optical channel spacing, negligible electro-optical element crosstalk and negligible network nonlinearities, all that was generally required was to increase the power on the transmitter channels in order to have negligible error rate at the optical receiver.

Thus, forward error correction (FEC) was not necessary in those times. However, as the transmission capacity of such systems has increased as well as the baud rate of signal transmission, together with denser wavelength division multiplexing (DWDM) and closer channel spacing and therefore higher crosstalk affinity, the deployment of FEC has become widely prevalent in optical transport systems today. The reason why that higher channel transmitted power cannot be employed is that optical fiber nonlinearities prevent increases in power. For example, four wave mixing (FWM) and amplified spontaneous emission (ASE) may become significant and deteriorate the channel signals. Second, employing FEC provides a cost-performance tradeoff. The use of FEC permits longer signal reach over the optical communication link before signal channel regeneration is a necessity. This is because the optical link can operate at lower received signal power to achieve the same BER specified or necessary for successful system operation. However, the tradeoff requires additional signal processing at the optical receiver to decode the FEC and provide signal correction for erroneous signal bits to achieve desired or lower BER. Thus, FEC is typically used to provide significant savings in the overall optical power budget of a fiber link, by allowing the system to operate at a much higher line BER. For example, the (255,239) Reed-Solomon code (cited above) corrects a $10^{-4}$ line BER to $5 \times 10^{-15}$. With FEC, the optical link can support line BER rates up to about $10^{-4}$, report on the high BER in real-time, and correct the errors to better than $10^{-12}$, which is a typical target maximum BER for optical communication networks.

Forward error correction or FEC is a technique for using error-correcting code to reduce the bit error rate (BER) on a communication channel. The process involves the transmission of additional bits with the client signal to provide signal redundancy of the client signal data bits. These redundant bits are employed at the optical receiver to correct most of the errors found in the actual client signal data bits. This process therefore can enhance the BER at the optical receiver so that an acceptable or lower BER can be realized. Thus, in simple terms, FEC is a process for reducing the transmitted signal error rate by employing the transmitter to send (i.e., "forward") redundant client signal bits using error-correcting code.

A recent advent in optical transmission equipment has been the advent of multiple channel optical transmitter photonic integrated circuit (TxPIC) and multiple channel optical receiver photonic integrated circuit (RxPIC) chips as disclosed and taught in U.S. patent application Ser. No. 10/267,331, filed Oct. 8, 2003, which application is owned by the common assignee herein and is incorporated herein by its reference, and U.S. Pat. No. 7,116,851, issued Oct. 3, 2006, supra, from which this application is a continuation-in-part. The TxPIC and RxPIC are monolithic chips, having multiple active and/or passive elements integrated on a single substrate. Reference to a PIC chip also includes integrated circuits known as a planar lightwave circuit (PLC). The TxPIC chip comprises an integrated array of modulated sources, defined as an array of directly modulated laser sources or an integrated array of laser sources integrated with electro-optic modulators. Each of the modulated sources represents a signal channel, each of a different emission wavelength, for generating an optical signal for transport in an optical communication network. The modulated sources have their outputs coupled to inputs of an integrated optical combiner. For example, the laser array may be DFB lasers or DBR lasers. The electro-optical modulator may be comprised of electro-absorption (EA) modulators (EAMs) or Mach-Zehnder modulators (MZMs). The optical combiner is preferably a wavelength selective combiner or multiplexer, where examples of such a wavelength selective combiner are an Echelle grating or an arrayed waveguide grating (AWG). The disclosure of this application illustrates many different embodiments of the TxPIC and RxPIC, applications of the TxPIC and RxPIC in an optical transport network and in wavelength stabilization or monitoring of the TxPIC and RxPIC. Such a monolithic TxPIC or RxPIC chip with integrated multiple signal channels and integrated wavelength selective combiner is the first of its kind anywhere in use in optical transport equipment as well as disclosed in the art.

The deployment of multiple channels in a PIC results in compromised performance vis-à-vis each other. Said another way, integrating multiple active and/or passive elements on a single chip requires performance tradeoffs between the elements. For example, one trade-off might be degradation in laser performance across the array of laser sources, such as in the case of threshold current, spectral characteristics, and operational efficiency as well as increase in relative intensity noise (RIN). Second, performance degradation across the transmission wavelength window may occur in the array of modulators. It should be understood that placing a practical number of operable wavelengths on a TxPIC to achieve worthwhile integration results in a range of laser wavelengths within a modulator operating window that is inconsistent with techniques and approaches employed in the past and is a monumental task. Besides transmitter impairments, a communication system must also deal with impairments on the receiver, or RxPIC, that may include, but are not limited to, semiconductor optical amplifier (SOA) and/or photodetector (PD) noise, noise figure (NF), polarization dispersion loss (PDL), polarization-dependant gain (PDG) penalties, etc.

Specific devices have been developed to help reduce some sources of signal noise. For example, an optical isolators, or Faraday isolators, is designed to allow transmission of a signal in only one direction, e.g., downstream from the transmitter, but block transmission, or reflections in the opposite direction, that would otherwise degrade the performance of upstream optical devices, such as the laser or modulator. However, if an optical isolator is located immediately after a laser or modulator to protect those optical devices from noise and reflection then integrating then integrating them into a monolithic device would be difficult as materials used in an optical isolator include ferro magnetic magneto-optical material. Consequently, a need arises to eliminate the need for an optical isolator, or to provide a monolithic device that does not require an optical isolator on the integrated circuit, e.g., that does not require an optical isolator be placed immediately after the laser or modulator.

In the fabrication of a dense WDM system on a single PIC chip, very precise wavelength control across the laser array integrated on the chip is important. In present conventional systems employing discrete laser sources or EMLs, this is not an issue because individual laser or EMLs can be binned and later mixed and matched at the system level according to their peak lasing wavelength. However, in the case of integrated arrays of lasers on a single chip, there is no luxury to mix and match because all of the optical signal sources are formed in large scale photonic integration in close relationship and, therefore, the performance of all the lasers in the array must be initially and successfully fabricated to desired specifications so that all of the integrated electro-optic elements on a PIC respectively meet the requisite assigned grid wavelength emission and operational specifications without unacceptable signal distortion deterioration if desirable yields of such photonic integrated circuits or PICs are to be realized. Thus, what is required is to initially achieve a sufficient wafer yield of sufficiently distortion-free transmission channels as well as wavelength control across an integrated circuit with a modulated source array comprising a plurality of modulated sources in order to achieve a dense WDM system on a semiconductor chip, such as an InP-based semiconductor PIC. In addition, after the demanding wavelength requirements are met, the other transmission properties (e.g., power, BER, optical channel noise, etc.) must be sufficient across all PIC signal channels for the intended optical signal transport application. While the TxPIC carries many different active and passive integrated components, by far, the laser sources, such as a DFB laser array, have the tightest wavelength specification requirements, compared with the EA modulator array, which may have a wider wavelength operation window. Said another way, the TxPIC yield will be a strong function of DFB yield, especially wavelength yield, where the array of DFB lasers for each PIC die are substantially operating at desired on-chip emission wavelengths and sufficiently free of signal distortion or deterioration. Similarly, a sufficient wafer yield of sufficiently distortion-free receiver channels is needed for integration of a WDM system on a semiconductor chip. In the RxPIC, receiver channel noise and cross-talk can also affect a received signal quality up to the point it is translated into the electrical domain for digital signal processing.

Thus, as indicated previously, having the optical channel signals generated on a monolithic, large scale integration, multi-channel PIC chip have some attendant issues relative to providing acceptable BER levels at the optical receiver. In particular, issues can arise from either the serial coupling of active/passive elements in a given channel (intrachannel) or the interaction between the active/passive elements from one channel to another (interchannel). Because the signal channels are physically much closer to one another on a PIC having multiple channels, such as compared, for example, to the use of discrete modulated sources and discrete wavelength selective combiner, and because they are generally interconnected by low-loss waveguides and passive elements, there is an increase potential of signal distortion or deterioration due to, for example, channel crosstalk, RIN, SMSR, optical feedback channel noise, occasional wavelength hops. Also, in connection with feedback channel noise, there is reflected feedback, such as optical feedback reflection from the wavelength selective combiner in the channel sources, which can also deteriorate channel signal quality.

Referring now to FIGS. 1A through 1D, graphs of channel performance for a multichannel communication device/system and the resultant BER channel performance are shown. FIG. 1A graph 100 illustrates a hypothetical performance versus wavelength profile 102 for a monolithic integrated circuit having multiple channels for traversing wavelengths $\lambda_1$ through $\lambda_N$ where 'performance' can be any performance metric, e.g. gain, dispersion performance, etc. FIG. 1A shows a performance minimum on $\lambda_1$, while the balance of the channels has approximately equal performance. FIG. 1B provides an exemplary BER by channel graph 120, corresponding to the channel performance profile shown in FIG. 1A. That is, the minimum performance in channel for $\lambda_1$ of FIG. 1A may appear as an unacceptable BER, per threshold 104, on the same channel, $\lambda_1$, shown in FIG. 1B, or on a different channel such as might arise from cross-talk. While FIGS. 1A and 1B illustrate a performance/BER channel coupling for a monolithic IC communication device, FIGS. 1C and 1D illustrate a similar performance/BER channel coupling for an optical line amplifier. FIG. 1C graph 140 illustrates an EDFA gain (G) vs. wavelengths $\lambda_1$ through $\lambda_N$. Unfiltered gain profile versus wavelengths 142 can be compensated by a flattening filter, as is know to those skilled in the art, thereby producing a resultant flattened gain profile 144 that is typically not completely flat and linear, as shown. Similar to FIG. 1A, FIG. 1C shows different channels performing differently on gain, thereby resulting in a max performance on channel $\lambda_2$, and a minimum performance for channel for $\lambda_{N-1}$. FIG. 1D provides the exemplary BER v. wavelength graph 160 that corresponds to the performance versus wavelength shown in FIG. 1C in channel. Thus, the minimum gain channel, $\lambda_{N-1}$, corresponds in this example to a maximum BER that exceeds BER threshold 146. Because of the failure of $\lambda_{N-1}$ to meet the threshold BER, the communication device responsible for the poor performance, e.g., a TxPIC and/or an RxPIC, may be unsuitable for field application, despite the satisfactory performance of the balance of the channels on the chip. Consequently, a need arises for a means to recover a chip with one or more channels that fail to meet BER, or other performance metrics, when the balance of the channels are satisfactory.

Referring now to FIG. 2, a schematic view of a communication network 200 with multiple sources of noise is shown. Many sources of noise and signal distortion arise in a communication network. Sources can include, but are not limited to noisy PICs 205-208, acting as either transmitters or receivers or transceivers (e.g. PIC 205 is TxPIC to PIC 206 as RxPIC, while PIC 207 is RxPIC to Pic 208 TxPIC, thus providing), that are coupled via a communication channel, e.g., bidirectional fiber link 202A and 202B, themselves causing noise and distortion and from environmental factors on the channel 203. A cumulative summation of noises from all sources, $$\sum_{i=0}^{n}$$

noise(i) determines whether the received signal together the noise and distortion Input signal on line 204 is a clean electrical signal from a local client, from which PIC 205, as a transmitter, generates an optical signal for transmission on the line fiber link 202, e.g. an optical fiber. Channel noise and interference may arise from optical couplings, splices, taps, in-line amplifiers, compromised cladding, and other environmental influences. An ideal system would generate an output signal from transmitter 205 with extremely low noise or distortion. However if a noisy transmitter generates an unusually high amount of errors, it may consume the ability of a per-channel FEC to recover the data. Consequently, a need arises for a system to compensate and recover data when a transmitter or receiver are responsible for high error rates or signal distortion.

Referring to FIGS. 3A through 3C, graphs illustrating sources for signal degradation based on channel parameters are shown. FIG. 6A graph 300 illustrates compact channel spacing 302 grid. Because of the proximity of adjacent channels, e.g., $\lambda_1$-$\lambda_2$, potential interference 304 on the fringes of the channels might result in destructive signal interference, and hence bit errors, during communication. FIG. 6B illustrates channel performance graph 320 resulting from optical impairments, that potentially could lead to phase shift, frequency offset and drift, that could produce actual interference 326, despite an apparently sufficient guard band based on the nominal channel spacing 324. FIG. 6C illustrates a graph 340 of bandwidth goals for a photonic chip. The effective bandwidth of a convention chip is constrained to nominal bandwidth 342, due to non-linear or non-scalable performance of active and/or passive devices, as well as to process variations and optical impairments during fabrication. Future bandwidth requirements may be extended to accommodate growth in data transport rates. Consequently a need arises to overcome the errors generated by close channel spacing, manufacturing, or fabrication optical impairments, and bandwidth nonlinearities in order to meet future demands for expanded operating envelope.

SUMMARY OF THE INVENTION

According to this invention, one way of combating the foregoing issues of signal distortion and deterioration in PICs and PLCs is to employ forward error correction (FEC) in combination with the PIC, in particular, a multi-channel PIC chip (TxPIC and/or RxPIC). Also, the operating parameter specification of a multi-channel PIC can be relaxed by utilizing FEC in combination with optical communication devices so as to improve yield on the multi-channel PIC chip Also, the operation windows of the active and/or passive elements on the multi-channel PICs can be made effectively wider thereby providing a wider choice of design in channel count and/or channel spacing. For example, the channel spacing can be made smaller thereby increasing the quantity of laser emission wavelength sources possible on a single multi-channel PIC chip. Alternatively, the channel spacing could be made wider, thereby allowing additional tolerances in the fabrication of the active and/or passive devices responsible for a targeted channel frequency. Such a multi-channel PIC chip, although having properties outside desired specifications for network operation, may still be acceptable to transmit distorted channel signals to an optical receiver if the generated optical channel signals also include FEC encoding which provides for compensation of numerous transmission penalties including penalties that arise from RIN, linewidth or SMSR degradation, or dispersion penalties, all of which may increase as the number of emission wavelengths, $\lambda_1, \ldots, \lambda_N$, increases in a multi-channel TxPIC.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIGS. 1A through 1D are graphs of channel performance for a multichannel communication device/system and the resultant BER channel performance.

FIGS. 3A through 3C are graphs illustrating sources for signal degradation based on channel arrangements.

DETAILED DESCRIPTION OF THE INVENTION

Figure 2:
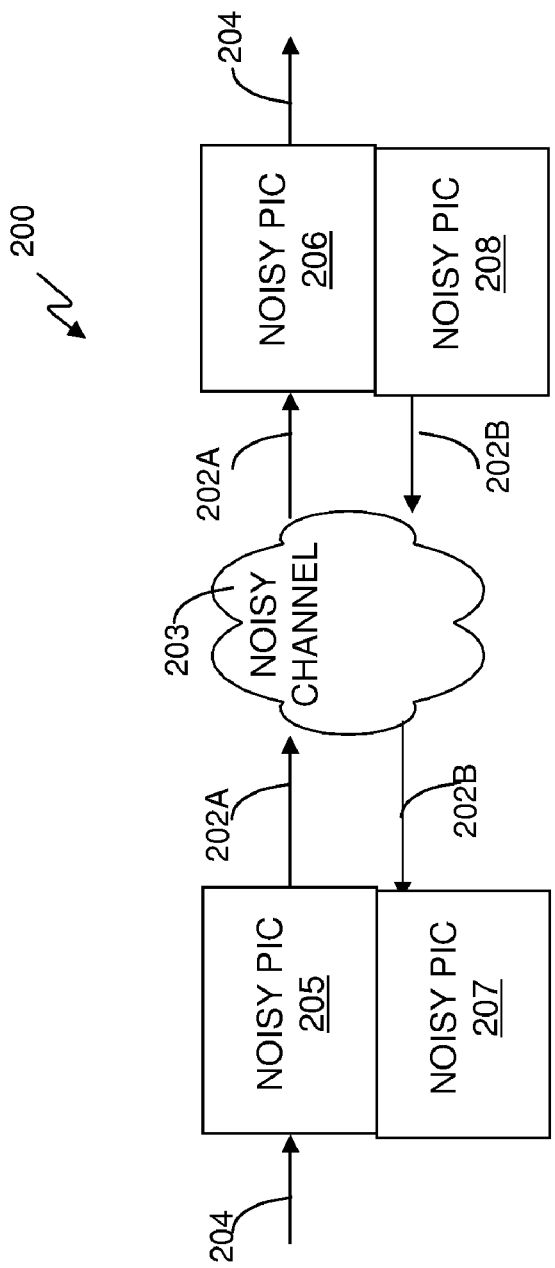
FIG. 2 schematic view of a communication network 200 with multiple sources of noise.
Figure 4A:
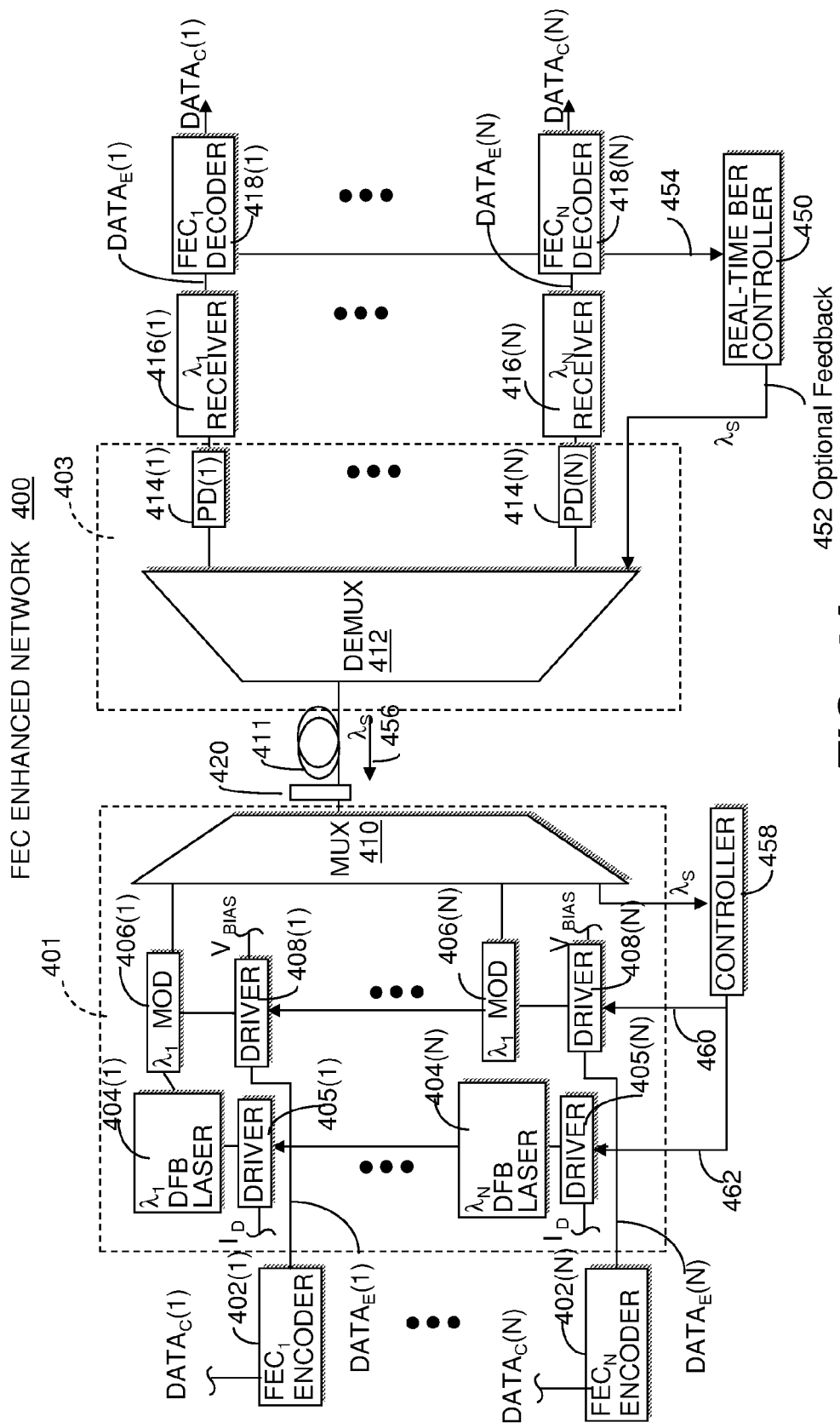
FIG. 4A is a schematic view of a forward error correction (FEC) enhanced system in an optical transport network in accordance with one aspect of the present invention.

Reference is now made to FIG. 4A of the present invention, as adapted from FIG. 70 of U.S. Pat. No. 7,116,851, supra. As shown in FIG. 4A, a forward error correction (FEC) enhanced optical transport network 400 shown as single direction transmission in a point-to-point optical transmission link including at least one multi-channel TxPIC 401 and at least one multi-channel RxPIC 403 in optical communication optical link 411. It should be understood that FEC enhanced network 400 can be bidirectional where multi-channel TxPIC 401 can also be a transceiver that includes a receiver, such as RxPIC 403 therein. In any application as a transmitter, receiver, or transceiver, the present invention is well suited to any combination and quantity of integrated or discrete transmitter and receiver components. For example, one communication system could use a transceiver with only a single integrated PIC pair (a TxPIC coupled to an RxPIC), while another system uses any combination of the two (e.g., one or more TxPICs in concert with or without discrete transmitter devices that are coupled to one or more RxPICs in concert with or without multiple discrete receiver devices). In such a bidirectional network, optical link 411 would be deployed for use with the eastbound and westbound traffic. Multi-channel TxPIC 401 includes, for example, a plurality of DFB or DBR laser sources 404(1) ... 404(N) optically coupled, respectively, to electro-optic modulators (MODs) 406(1) ... 406(N), such as, electro-absorption modulators or Mach-Zehnder modulators. The outputs of the modulators 406(1) ... 406(N) are optically coupled to a wavelength selective combiner or MUX 410, e.g., an arrayed waveguide grating (AWG) or an Echelle grating.

Still referring to FIG. 4A, each DFB laser source 404 has a driver circuit 405(1) ... 405(N). Each modulator 406(1) ... 406(N) includes a driver 408(1) ... 408(N) for input of the bias point of each modulator and for input of a data source signal together with FEC representation of the data source signal for optical signal generation. $FEC_1$ ... $FEC_N$ encoders 402(1) ... 402(N) are employed to reduce errors in transmission of data transmitted over network 400, particularly due to signal distortion and deterioration developed from the integration of multiple active and/or passive elements, multi-channel large scale integrated chip. Chips 404, 406, and 410 can be InP-based chips as taught in U.S. patent applications, Ser. No. 267,331, filed Oct. 8, 2002, which application is incorporated herein by its reference. Encoders 402 may also be a joint FEC encoder 604, as shown in a subsequent figure to jointly encode all the signal source data. As well known in the art, the performance of a received or transmitted signal is measured deploying an eye diagram. Further, $FEC_1$ ... $FEC_N$ encoders 402(1) ... 402(N) are deployed to reduce the bit error rate (BER) by transmitting on the laser source light output additional bits through the employment of error-correcting code providing redundant information of the data bit stream of the data sources, along with the transmission of the signals from the data source. The error-correcting code is deployed at the optical receiver for correcting most errors occurring in transmission of the data bits thereby increasing the immunity of system 400 from noise, for example, resulting from channel crosstalk, RIN optical feedback channel noise, occasional wavelength hops, SOA and/or photodetector (PD) noise, noise figure (Nf), polarization dispersion loss (PDL), polarization-dependant gain (PDG) penalties, etc.

The encoders 402 are shown in connection with the transmission of redundant encoded data bits via modulators 406, i.e., the FEC encoders 402 can be deployed between the modulated data source or modulators 406 and the multiplexer 410. Alternatively, encoders 402 may be coupled to transmit the redundant encoded data bits via directly modulating laser sources 404 rather than using an external modulator 406 as shown in the illustrated embodiment. At the optical receiver end, the RxPIC chip 403 comprises a DEMUX or wavelength selective decombiner 412 and a plurality of photodiodes (PDs) 414(1) ... 414(N), one each for each channel signal, $\lambda_1$ ... $\lambda_N$, transmitted from multi-channel TxPIC chip 401. Multi-channel RxPIC chip 403 may also include an optical amplifier at its input; either integrated into the input of the chip (not shown), or an external optical amplifier, e.g., an erbium-doped fiber amplifier (EDFA) (not shown) either operating on all channels or a per channel basis, or any combination of these. The electrically converted signals are respectively received in receivers 416(1) ... 416(N) and the FEC encoded data is decoded at $FEC_1$ ... $FEC_N$ decoders 418(1) ... 418(N). The details relative to receivers 416 are discussed in parent U.S. Pat. No. 7,116,851, supra. It should be noted that $FEC_1$ ... $FEC_N$ decoders 418(1) ... 418(N) may also be a joint FEC decoder 656, as shown in a subsequent figure, for all signal channels which are decoded as a group. While the present embodiment illustrates a 1:1 relationship with an encoder 402 and a decoder 418 applied to each and every channel, the present invention is well-suited to an asymmetric application of the encoder/decoder pairs. For example, the design or field-use of a given transmitter/receiver may identify a particularly noisy or distorted individual channel(s) at the lower frequency. The present invention can be applied to this design by singling out the weakest, or noisiest, channel (s) in the system, and applying the FEC hardware and algorithms to those channel(s), while leaving the balance of the channel(s) with either no FEC function or with FEC that utilizes a dedicated FEC encoder 402/decoder 418 for a given channel, e.g., without code sharing with other channels. The effect is to apply coding overhead (power, chip real estate, latency, etc.) only where a need exists, and a benefit derived. In yet another embodiment, the FEC capability and hardware can exist at every channel, but in use be dynamically turned on or off depending on the application, quality of service, field performance, degradation of channel performance over time, etc. Similarly, the joint FEC encoder/decoder can be programmed to only encode/decode dedicated channels rather than applying to every channel. In this situation, if matching data rates between FEC encoded channels and non-FEC encoded channels are to be maintained, then the non-FEC encoded channels can be bit stuffed.

An alternative embodiment to the present invention is also shown in FIG. 4A, wherein the FEC decoded data is received on line 454 for providing the BER data to real-time BER controller 450. Controller 450 discerns such parameters, such as, output power level of DFB laser sources 404, the bias point and chirp of modulators 406 and decision threshold values, such as the threshold decision voltage at the receiver as well as the phase and threshold offset relative to the eye diagram. In the alternative embodiment, controller 450 provides feedback service channel information via line 452 feedback through demultiplexer 412, optical link 411 (as shown by arrow and $\lambda_S$ 456) to controller 458 on the transmitter side. The service channel data is then provided to DFB laser sources 404 via line drivers 405(1) ... 405(N) to correct the intensity of a respective laser source. Also, correction signals are provided on line 460 to modulator drivers 408 of modulators 406 to make adjustments on the rise time of modulated data, particularly in cases of lone data pulse "1's", to adjust the cross-over point, as discussed in the parent application, to adjust the bias point of the modulator and to enhance the extinction ratio of the modulator as well as change the modulator chirp (alpha parameter), and to make RF magnitude adjustments on the modulated data stream. At the receiver, controller 450 also makes adjustments to receivers 416 in particular to adjust decision threshold values, such as phase and threshold offset, to respectively achieve better data recovery within the decision window of the eye and offset the decision threshold from the eye position of most noise on the data stream.

While the present embodiment utilizes a wavelength selective combiner for mux 410, another embodiment utilizes a slab combiner, although the efficiency loss makes it less practical. In the present embodiment an optional optical isolator 420 is not implemented because the FEC algorithm allows the communication system 400 to recover from any nominal errors, noise, signal degradation arising from the transmitter, transmission fiber, or receiver, and associated electronic driver circuitry, whether the chip includes only one integrated channel or multiple integrated channels. But in another embodiment, an optional optical isolator, or opto-isolator, 420 is utilized, by coupling to the output from transmitter 401 to reduce noise and provide a lower BER for applications with extremely low BER requirements, such as telecommunications. Additionally, while the present invention illustrates the multi-channel communication system as having integrated channels on a TxPIC and an RxPIC, the present invention is well-suited to a non-integrated discrete optical element communication system utilizing FEC correction, either with or without code sharing, with the subsequent benefit that either an optical isolator is not required for error correction. For high-quality extremely low BER requirement signals, e.g., for telecommunication, an optical isolator can be implemented downstream of a laser, modulator, and combiner, or mux, for improved signal integrity.

Figure 4B:
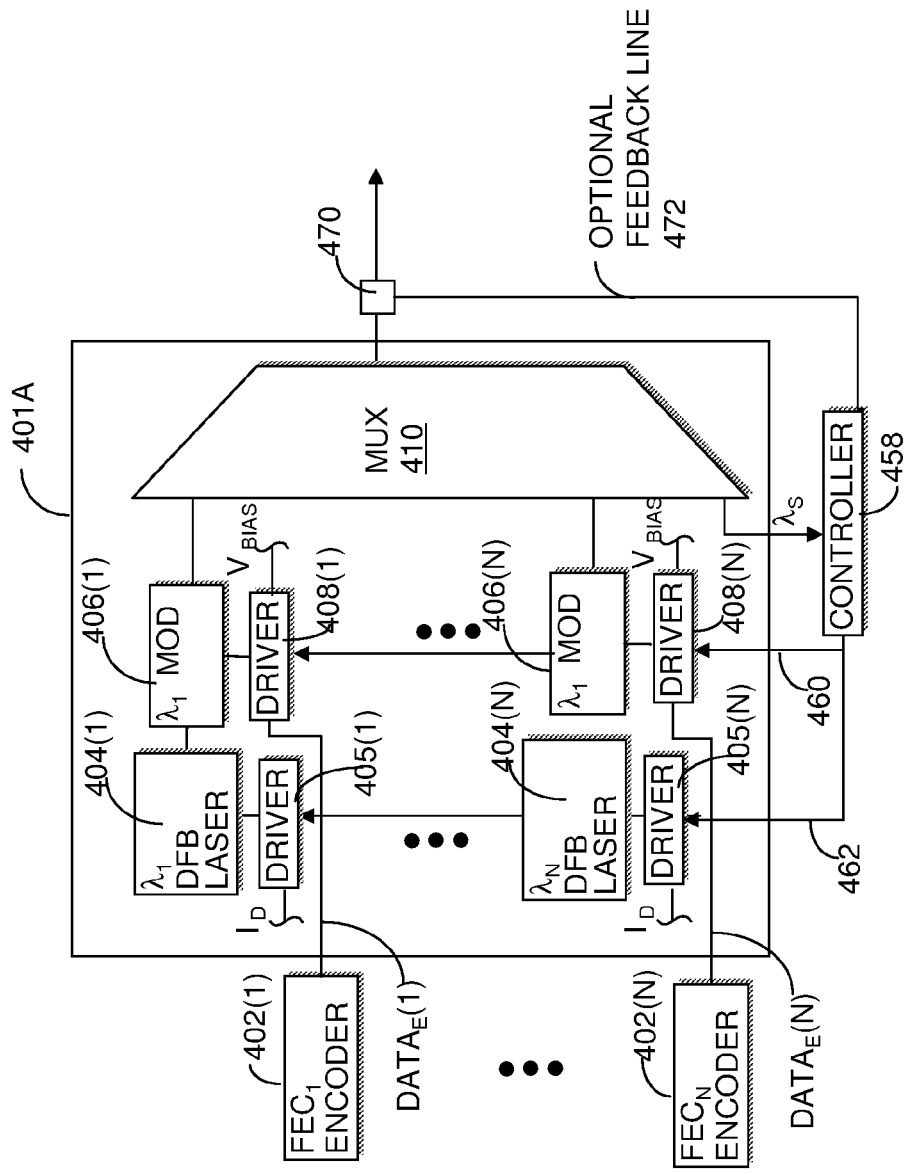
FIG. 4B is a schematic view from FIG. 4A detailing the TxPIC chip transmitter part, in accordance with one aspect of the present invention.

FIG. 4B illustrates the multi-channel TxPIC-FEC encoding portion of the network 400 shown in FIG. 4A. FIG. 4B illustrates an upgraded multi-channel TxPIC that includes a plurality of FEC encoders 402(1) to 402(N) installed between data sources (not shown) and multi-channel TxPIC 401A. The encoded signals from encoders 402 are provided to modulators 406 via the DATA line to their associated drivers 408(1) . . . 408(N). There may alternatively be an encoder 402 for each signal channel, which channel is represented by laser/modulator combinations 404(1)/406(1) through 404(N)/406(N), or there may be a joint FEC encoder that encodes all the signals that are provided to modulator drivers 408. The deployment of FEC coding with a large scale integrated, multi-channel PIC substantially increases the tolerance at the optical receiver to receive distortion-ridden, transmitted channel signals and still provide the required BER via error correction algorithms at the FEC decoder.

In the FEC encoded TxPIC system of FIG. 4B, the improved noise immunity is exploited to transmit a higher data rate optical signal without the need for a substantial commensurate increase in transmission power level of the signal channels. Also, it should be noted that the FEC coding itself consumes some of the additional transmission bandwidth, due to the inherent redundancy of error correction coding. Nevertheless, the overall net baud rate of the signal channels can be increased or the present signal distortions imposed upon the optical channel signals generated in multi-channel TxPIC 401A, such as due to on-chip feedback, laser RIN limitations, channel crosstalk, laser and/or modulator chirp, or SMSR, etc., can be tolerated at an optical receiver with FEC decoded and provide an optical-to-electrical converted signal with a BER of $10^{-12}$ or lower, such as about $10^{-15}$. Thus, the beauty of the combination of a multi-channel semiconductor TxPIC chip and FEC encoding is that a chip with foregoing impairments due, in a large part, to the integration of a plurality of signal channels, on the receiver or transmitter, can successfully provide for the transmission of a DWDM signal comprised of PIC generated channel signals from a multi-channel TxPIC transmitter that are readily discernable at the optical RxPIC receiver with acceptable BER levels in spite the present of any of the above mentioned impairments which would normally render the PIC unworthy of transmission or reception deployment. Also, importantly, multi-channel TxPIC or RxPIC chips which are not to spec, such as, providing too much signal distortion due to semiconductor chip impairments, can be render acceptable with sufficient BER at the optical receiver, i.e., BER at $10^{-12}$ or lower, with the deployment of FEC coding with the PIC chip as prescribed by this disclosure.

In FIG. 4B, an optional embodiment to the present invention includes an optical feedback of a portion of the DWDM output signal from multi-channel TxPIC 401A that may be provided via tap 470 and optical feedback line 472 to controller 458. This feedback is analyzed and employed to control the bias current to laser sources 404 via lines 462, or to control the bias current to on-chip heaters (not shown), one adjacent to each laser source, or to adjust the chirp at modulators 406 via lines 460 by adjusting the modulator bias level and its swing or peak-to-peak bias as discussed, at least in part, in U.S. patent application Ser. No. 11/045,462, filed Jan. 27, 2005, which application is owned by the assignee herein and is incorporated herein by its reference. The above mentioned use of on-chip heaters, which are used to control laser source emission wavelength are disclosed in U.S. Pat. No. 7,079,715 Issued Jul. 18, 2006, which application is owned by the assignee herein and is incorporated herein by its reference.

An important attribute of an error correcting code used in FEC is referred to as "coding gain". The coding gain indicates the effective increase in signal- to-noise ratio (SNR) attained by use of the code. For example, if a system experiences a given information bit error rate (BER) at a SNR of 20 dB without coding, and experiences the same BER at a SNR of 15 dB with coding, then the code has provided 5 dB of coding gain. When a multi-channel TxPIC 401A is upgraded with an additional, new multi-channel TxPIC that has increased channel capacity and/or increased baud rate capability, it is necessary to identify the code properties (e.g. coding gain, rate, and burst error correction capabilities) required to enable the increase in channel capacity and data rate without unacceptably impacting other channels in other multi-channel TxPICs or the overall DWDM signal. The apparatus of this disclosure comprising a FEC-implemented multi-channel TxPIC may be employed for uniformly sharing across a plurality of channel signals FEC coding gain which may be achieved through FEC encoding of a higher baud rate electrical data signal or through multiplexed or combined electrical data signals from multiple data sources prior to their subsequent demultiplexing and separate generation into optical channel signals which are multiplexed and launched onto an optical link as taught in patent application Ser. No. 10/712,732, filed Nov. 12, 2003, supra. The optical signal generation is achieved through reverse multiplexing of the higher baud rate data signal or of the multiplexed, FEC encoded plural data signals. Effectively, the coding gain power of the FEC encoder is spread over all the signal channels of the multi-channel TxPIC so that each channel can potentially benefit from performance above the average coding gain thereby increasing the coding gain of the worst noise signal channel and correspondingly reducing its BER at the receiver so that, now, the combined multiple channel signals may be propagated further along the optical transmission medium before signal interception is required, such as required channel signal regeneration (3R). By coding gain averaging, the coding gain is taken from the lesser noise affected channels and spread over all the channels so the higher noised ridden channels obtain an effective increase in coding gain which corresponds to a higher reduction in BER at the optical receiver.

It should also be noted that with added channel capacity of a multi-channel TxPIC 401A the band of laser emission wavelengths, $\lambda_1$ to $\lambda_N$, of the laser array may be rendered smaller by reducing the signal channel spacing between the emission wavelengths of the respective laser sources such as, for example, by reducing the spacing from 400 GHz or 200 GHz to 100 GHz or 50 GHz channel spacing, respectively. Reducing channel spacing can also allow an increase in the quantity of channels in the transmitter and receiver. Reduction of channel spacing on the optical transmitter side renders the issue of channel crosstalk, ASE, RIN, and other noise on the optical receiver side a significantly larger problem and may be sufficiently significant so that the multi-channel TxPIC will not successfully achieve a DWDM signal transmission discernable at an optical receiver. However, a way of overcoming this issue is to improve the BER performance, beside forward error correction (FEC), by employing electronic signal processing (e.g., pre-emphasis, electronic equalization, electronic dispersion compensation (EDC)) to improve the multi-channel TxPIC BER over a given operating range which counteracts the increased crosstalk penalty occurring at the optical receiver. Such electronic signal processing is discussed in U.S. patent application Ser. No. 11/045,462, filed Jan. 27, 2005, supra. As an alternative to reducing channel spacing, the FEC enhanced system can maintain or increase the channel spacing between the emission wavelengths, $\lambda_1$ to $\lambda_N$, of the laser array, while increasing the fabrication and process tolerances affecting a targeted channel frequency on the integrated devices. The increased tolerances are desirable and beneficial to higher yield and/or reduced cost. However, the increased tolerances may increase interference, noise, or result in other performance impairments. However, the FEC enhanced system provides a solution to recover from the errors that may result from these optical impairments.

It should be understood that the disclosed invention can also be utilized in situations where there is an upgrade, for example, in the data sources baud rate, such as from WDM OC-48 to WDM OC-192, or from WDM OC-192 to WDM OC-768 (SONET rate of 39,813.12 Mbit/s), an older transmission network can be utilized through the principals of well know reverse muxing as also taught in U.S. Pat. No. 6,433,904 B1, which patent is incorporated herein by its reference.

Figure 5A:
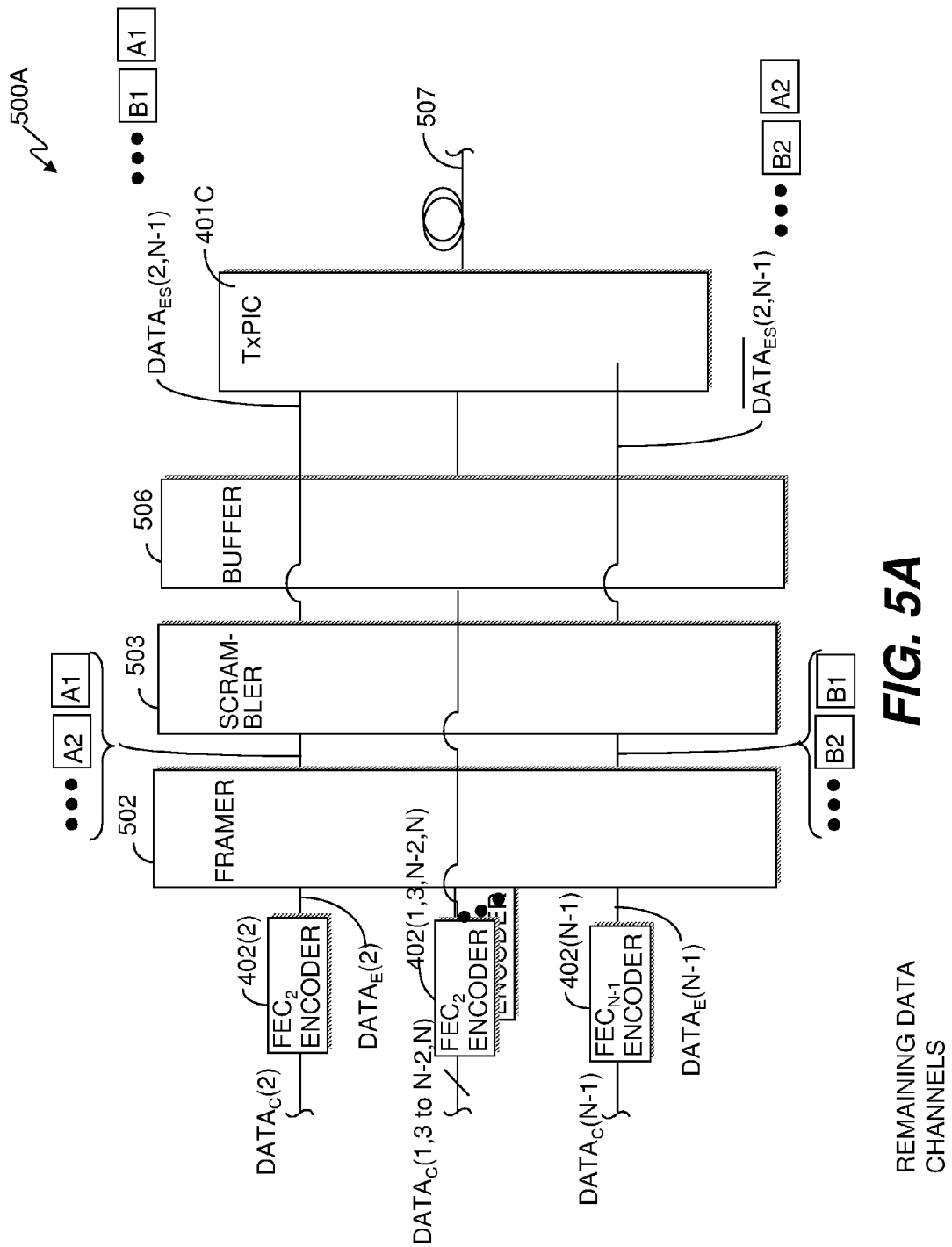
FIGS. 5A and 5B are a schematic view of channel-selective FEC enhanced system in an optical transport network, in accordance with one aspect of the present invention.
Figure 5B:
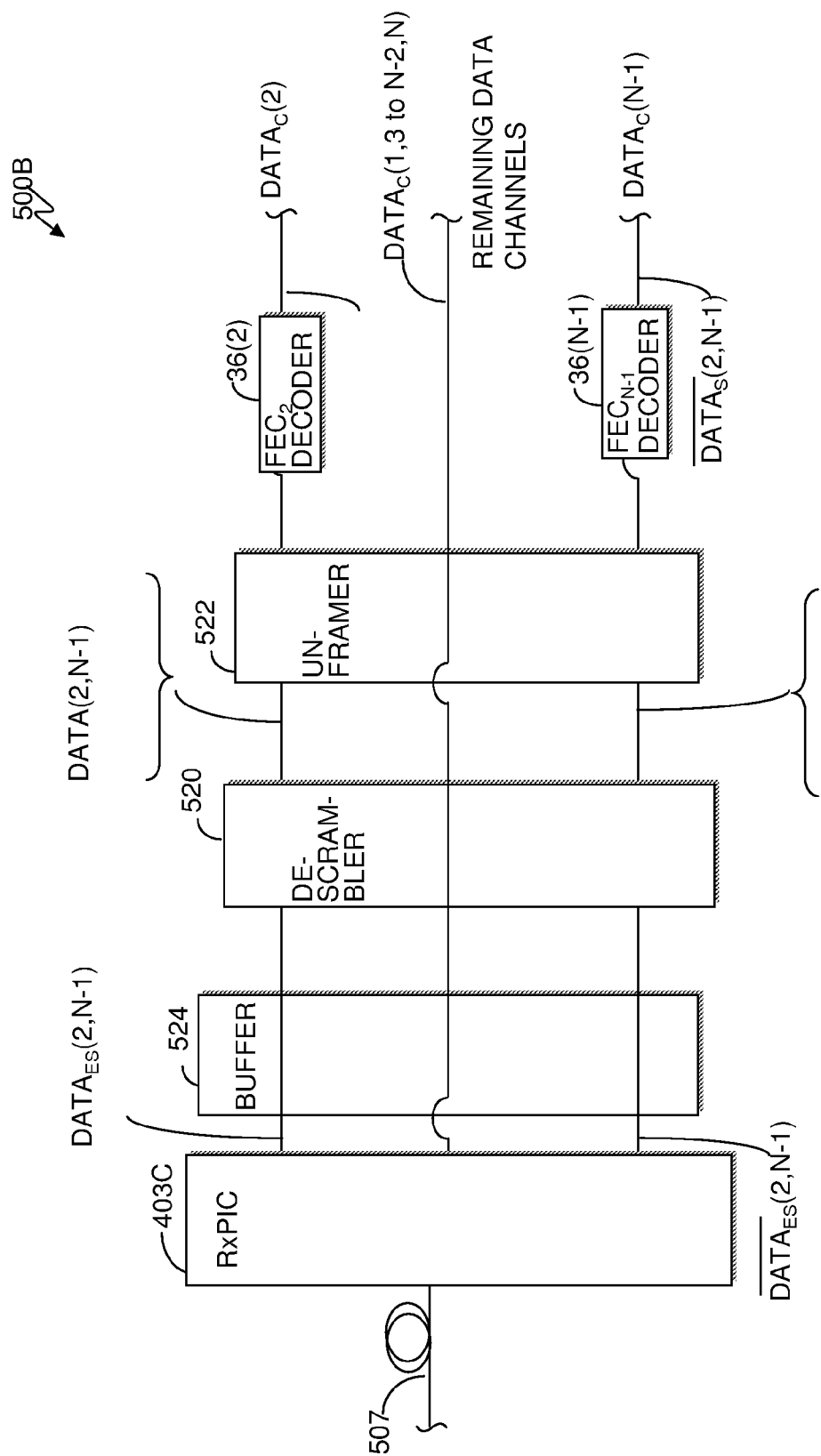

Reference is now made to FIGS. 5A and 5B that illustrate a schematic view of channel-selective FEC enhanced system 500A and 500B in an optical transport network, in accordance with one aspect of the present invention. FIGS. 5A and 5B enable a selective quantity of channels in a multi-channel system for FEC processing, thereby applying FEC where beneficial and not applying FEC where unnecessary to satisfy BER requirements and not cost-effective in terms of processing time, power consumption, chip real estate, and other performance parameters. Consequently, by utilizing the present embodiment, the present invention is able to incorporate into production a chip that might otherwise have unsatisfactory BER, doing so in a cost-effective manner by utilizing code sharing of high-BER performance channels towards low-BER performing channels.

In the present embodiment, only two channels are utilized for the code sharing scheme in a multi-channel communication device. The two channels identified are a high-BER performance channel, e.g. channel $\lambda_2$, and low-performance channel $\lambda_{N-1}$, as shown in exemplary FIGS. 1C and 1D. Data for the two FEC channels are respectively: 1) received as client data $Data_C(2)$ and $Data_C(N-1)$ at $FEC_2$ encoder 402(2) and $FEC_{N-1}$ encoder 402(N-1) which resultantly yields the encoded data stream $data_E(2)$ and $data_E(N-1)$ that is fed to framer 502. In framer 502, the data is subsequently framed, packetized, or digitally wrapped with any type of format and protocol, either standardized or proprietary, that allow the data from the plurality of channels to be interleaved or scrambled, e.g., identifying a start, end and/or contents of the frame or packet. via marker, header information, and other techniques known to those of skill in the art to allow for recovery of the client signal at the receiver. In the present embodiment, data from channel 2 is packetized as A1, A2, etc. while data from channel N−1 is packetized as B1, B2, etc., after framer 502, and is fed to scrambler, or interleaver, 503, which rearranges or interleaves the packets as indicated by $data_{ES}(2,N-1)$, and the complementary data indicated by bar $data_{ES}(2,N-1)$ because the data on this line now includes data from both channel 2 and N−1, e.g., packets A1, B1, etc. that bypasses buffer 506 and is ready for transmission on TxPIC 401C. In contrast to the client data above that are FEC encoded, the channels that do not utilize FEC encoding are shown simply as the complementary data, e.g., $data_C(1, 3$ to $N-2,N)$ on line 402(1,3 to N−2, N) which bypass framer 502 and scrambler 503 but feed into buffer 506, where memory buffer can match the appropriate delay seen by FEC encoded channels 2 and N−1, and can match the additional data bits from FEC encoding by bit-stuffing the non-FEC encoded channels.

Both the FEC encoded and non-FEC encoded channels are received respectively on channels in TxPIC 401C, whose components and functions are essentially those of TxPIC 401A of FIG. 4B, for the electrical to optical (OE) conversion and subsequent muxing and transmission on fiber link 507 to a RxPIC, 403C, shown in FIG. 5B, whose components are essentially those of RxPIC 403 of FIG. 4A. The sequence of functional blocks and processes are complementary to those shown in FIG. 5A. Thus optical client data is demuxed are converted to electrical signals in RxPIC 403C. Afterwards, FEC encoded channels 2 and N−1 are descrambled, or delinterleaved, by descrambler 520, followed by decoding via decoders 36(2) and 36(n−1), and finally unframed by unframer 522, while non-FEC encoded channels 1, 3 to N−2, and N will bypass the FEC decoders, the descrambler, and the unframer and are instead feed into buffer 524 for latency matching to the FEC encoded data, and removing the bit-stuffing, and be output as remaining client data channels $data_C(1,3$ to $N-2,N)$. Consequently, this embodiment of the present invention allows for selective FEC encoding for a high BER channel with meted resources, thereby prolifically adding the chip to production yield, with minimal overhead. While FIGS. 5A and 5B show specific channels 2 and N−1, the present invention is well-suited to using any of the available channels as either the low-performance BER channel or the high-performance BER channel, and is well-suited to using any quantity of channels for either, as code sharing would allow, with the respective need for coupling and devices as consistent with the processing of data signals described hereinabove.

Figure 6A:
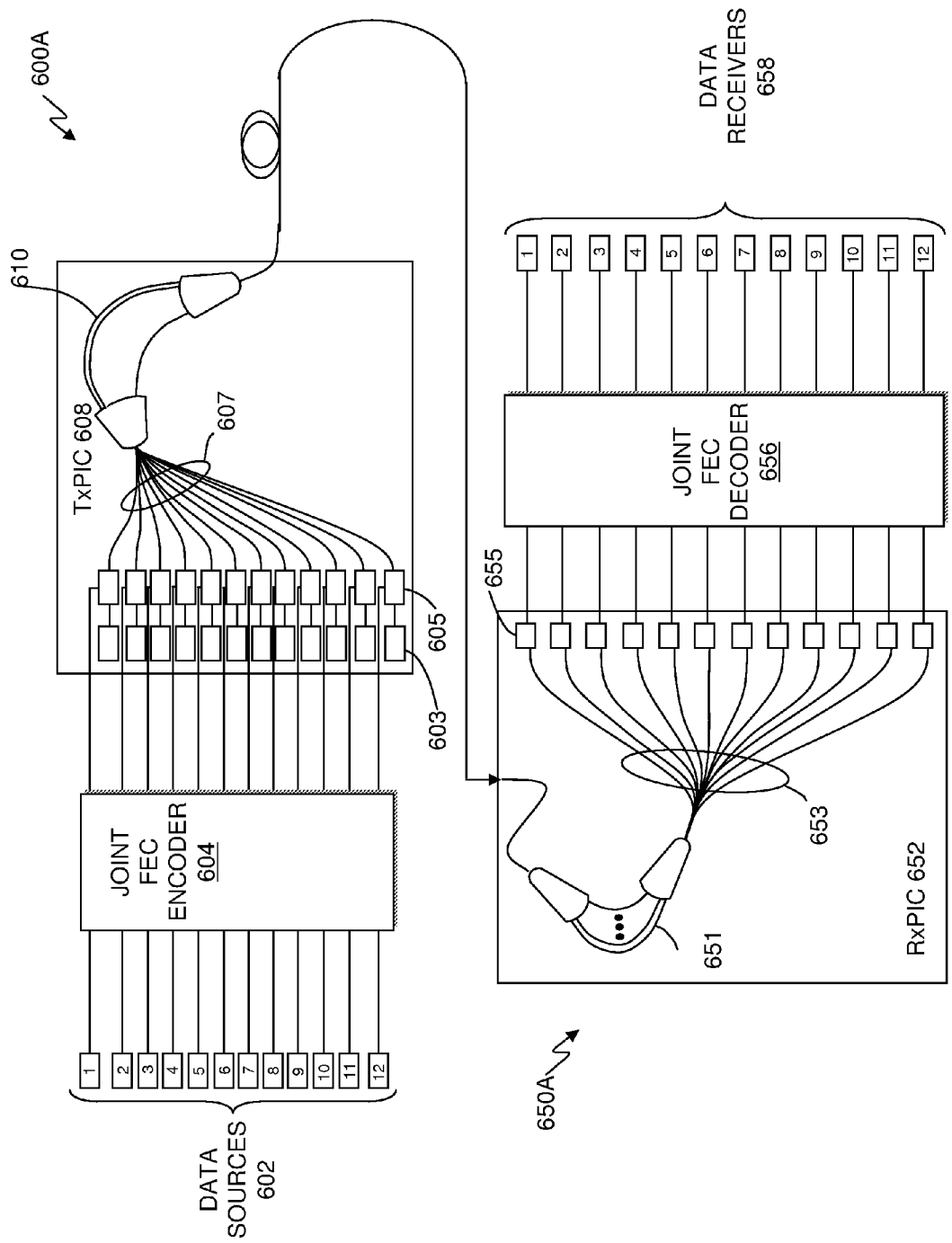
FIG. 6A is a schematic plan view of a joint-channel FEC encoded system in an optical transport network, in accordance with one aspect of the present invention.
Figure 6B:
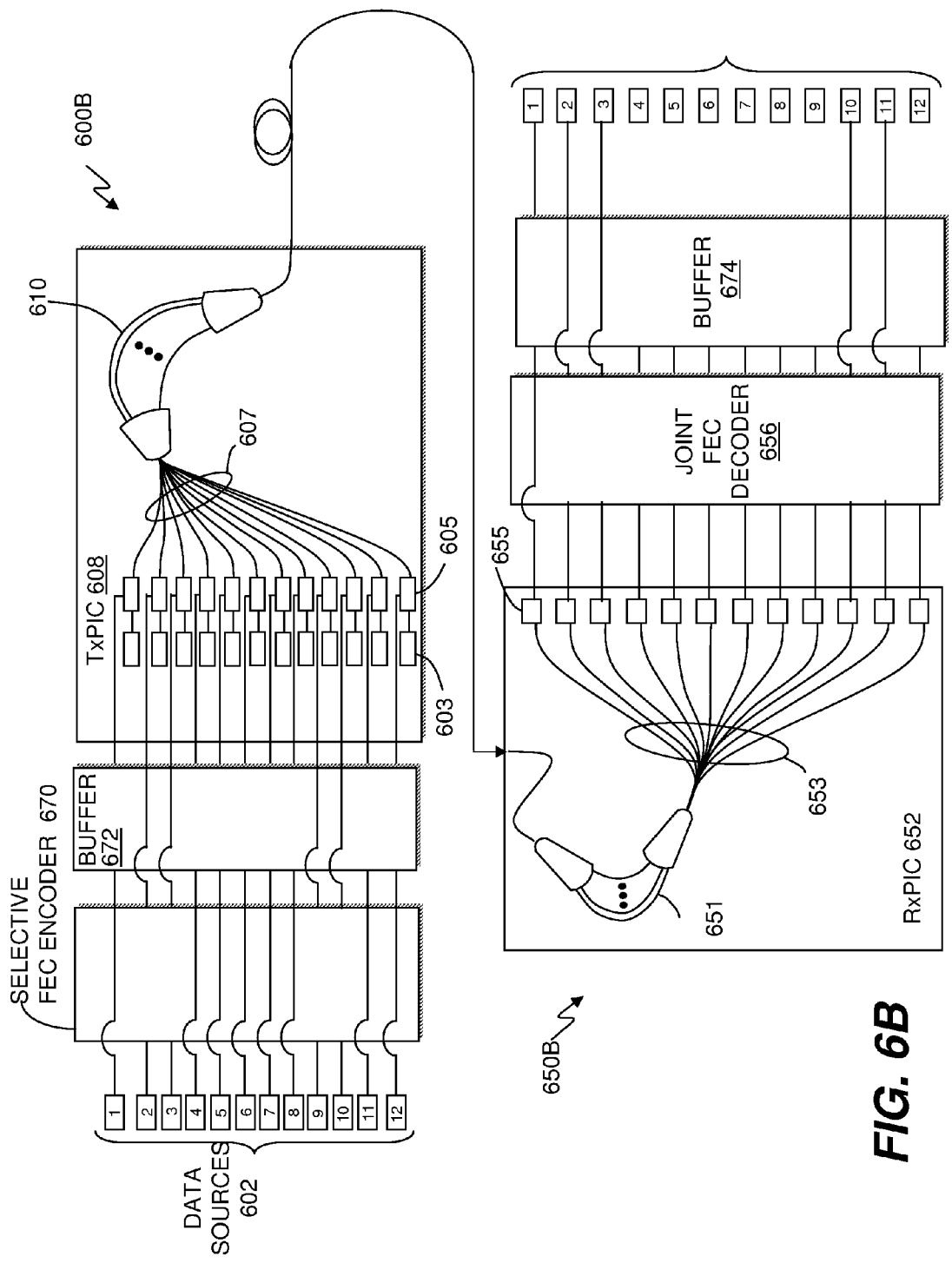
FIG. 6B is a schematic plan view of a channel-selective joint-channel FEC encoded system in an optical transport network, in accordance with one aspect of the present invention.

Reference is now made to FIGS. 6A and 6B which illustrate in more detail the multi-channel TxPIC chip and multi-channel RxPIC chip, as disclosed in patent application Ser. No. 10/267,331 and Ser. No. 10/267,304, both filed on Oct. 8, 2002, supra. While FIG. 6A shows a joint-FEC encoder that applies to all data channels, FIG. 6B in contrast selectively joint-FEC encodes only a selective portion of the data signals. Both FIGS. 6A and 6B allow for the joint-FEC encoding of coupled data channels via a common integrated circuit, as opposed to the discrete FEC blocks illustrated in previous FIGS. 4 and 5.

FIG. 6A shows a FEC-enabled, multi-channel TxPIC transmitter 600A coupled to RxPIC 650A via an optical link. Data sources 602, which number twelve (12) electrical signal sources which are provided to joint FEC encoder 604 where the signals are provided with redundant FEC coding. The signals are then provided to multi-channel TxPIC chip 608 comprising an array of signal channels, shown here as twelve (12) channels, each represented by electro-optical element pair comprising a cw-operated laser source 603 and an electro-optic modulator 605. The modulated FEC encoded channel signals from the twelve channels are provided on integrated waveguides 607 and provided to and multiplexed by an on-chip arrayed waveguide grating (AWG) 610 to form a WDM signal for transport on an optical link. As seen in FIG. 6A, the WDM signal is received from the optical link at FEC-enabled, receiver 650A comprising multi-channel RxPIC chip 652, and joint FEC decoder 656. Multi-channel RxPIC 652 receives the WDM signal at integrated arrayed waveguide grating (AWG) 651. The DWDM signal from the optical link is demultiplexed into individual wavelength channel signals where each demultiplexed signal provided to a respective output waveguide 653. Each waveguide 653 has a terminus with a photodetector 655 where the optical channel signal is converted into an electrical signal. The electrical signals are then taken off-chip and FEC-decoded at joint FEC decoder 656 and provided to data receivers 658. Data receivers 658 include clock and data recovery (CDR) circuitry with decision circuits (DECs) to determine the binary values of the decoded signals as known in the art. It will recognized by those knowledgeable in this art that decoder 656 can be part of data receivers 658 and also include transimpedance amplification (TIA) and automatic gain control (AGC) circuitry that initially receives the converted optical-to-electrical signals prior to FEC decoding as is known in the art.

Referring to FIG. 6B, a channel-selective joint-FEC encoder is shown. that encodes only a selective portion of the data signals. By only jointly encoding sleect5ive channels, the present embodiment provides error recovery with reduced power consumption, heat generation, chip gate count, among other factors, as compared to joint-FEC encoding of all channels as shown in FIG. 6A. Similar to FIGS. 5A and 5B, the present FIG. 6B uses a buffer to accommodate the non-FEC encoded channels latency and bit stuffing needs, while the selective FEC encoder 670 performs the necessary interleaving and encoding. In contrast to FIGS. 5A and 5B, FEC encoder 670 is a single common circuit among the channels rather than a discrete channel-specific FEC encoder, e.g., 402(2) for channel 2. Thus the present embodiment will provide benefits of integration such as more efficient layout with reduced area and the option of reusing common functions within the decoder among the different channels.

Figure 7:
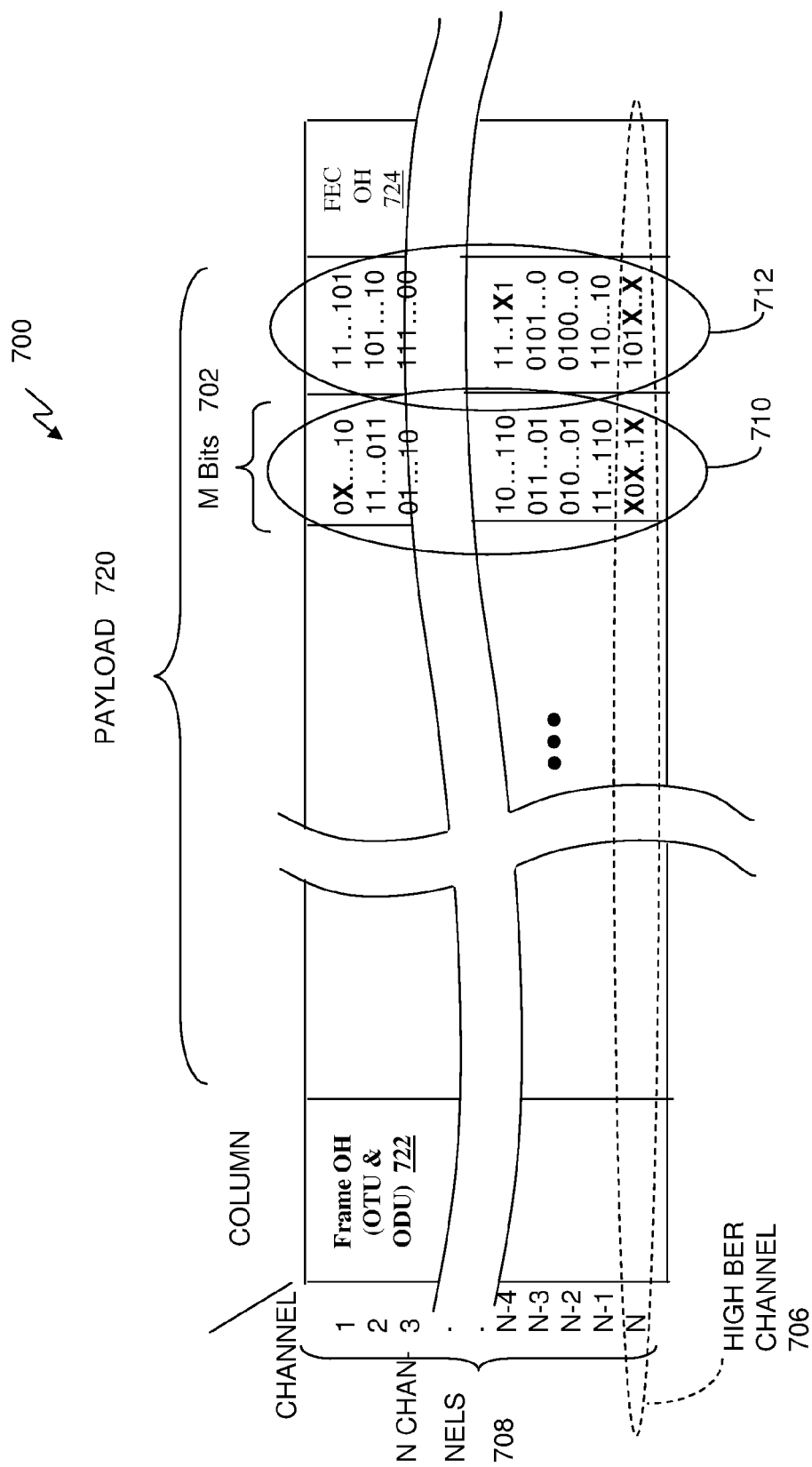
FIG. 7 is a diagram of framed data with code sharing FEC, in accordance with one aspect of the present invention.

Referring now to FIG. 7, a diagram of framed data 700 with code sharing FEC is shown, in accordance with one aspect of the present invention. Framed data can be utilized with FEC encoded transmitter and receiver as shown in FIGS. 6A and 6B. The framed data is comprised of payload data 720 for parallel channels 1 through N that are packaged with Frame overhead information (OH) 722, that is either standard-based or proprietary, and packaged with FEC OH data 724, to form a complete frame 700 in the present embodiment. Payload portion 720 of framed data 700 is blocked off in appropriate subframes, or so-called codegroups, e.g., 710 and 712 that are in turn comprised of M bits wide column 702 by N channel rows that together yield a desired bit count, e.g., 16K bits, for FEC encoding blocks. While an entire frame of say 500K bits might result in excessive latency for simultaneous encoding using conventional FEC circuits, the subframes are sized to provide a reasonable latency vs. code sharing tradeoff, thereby improving the manageability of the FEC encoding. However, the present invention is well suited to a wide variety of coding options, including hierarchy of codegroups within a subframe, different sizes of payloads and OH and codegroups. In the present embodiment, redundant FEC OH bits are stored in FEC OH section 724, while the original payload data remains unchanged. The present invention is well-suited to modified data FEC encoding where the redundant code bits are embedded with the original client data in the payload.

Errors are illustrated as "X" values in the bit stream, to indicate a one or zero recovered bit which is opposite of the intended value. Row N shows a high frequency of error values that would not be recoverable if FEC were performed on that channel alone using the same FEC algorithm, without any code sharing from a channel with acceptable or superior BER. In contrast, the balance of the channels, e.g., channels 1 to N−1 show almost no errors other than a few random errors. By using either all the channels together, or select high-performing BER channels, in the code sharing subframes shown, the present invention is able to reduce the overall BER of the subframe by diluting or spreading the low-performance BER channel errors, e.g., channel N, with one or more high-performance BER channels, e.g., 1 through N−1 over several sub-frames.

The use of a framed data from multiple channels provides approximately similar coding gain when averaged across all channels, in lieu of a conventional per-channel FEC architecture that would not allow for recovery of a low-performance FEC channel. The present embodiment also provides economies of scale with a joint FEC encoder, such as −3 dB normalized power generation and normalized gate count. A high-data rate client signal provides for low latency using the multi-channel approach with subframes. As a result, the present invention provides both improved overall system BER performance, recovery of a chip with an otherwise unacceptable BER channel, and reduced power generation and gate count parameters.

Figure 8:
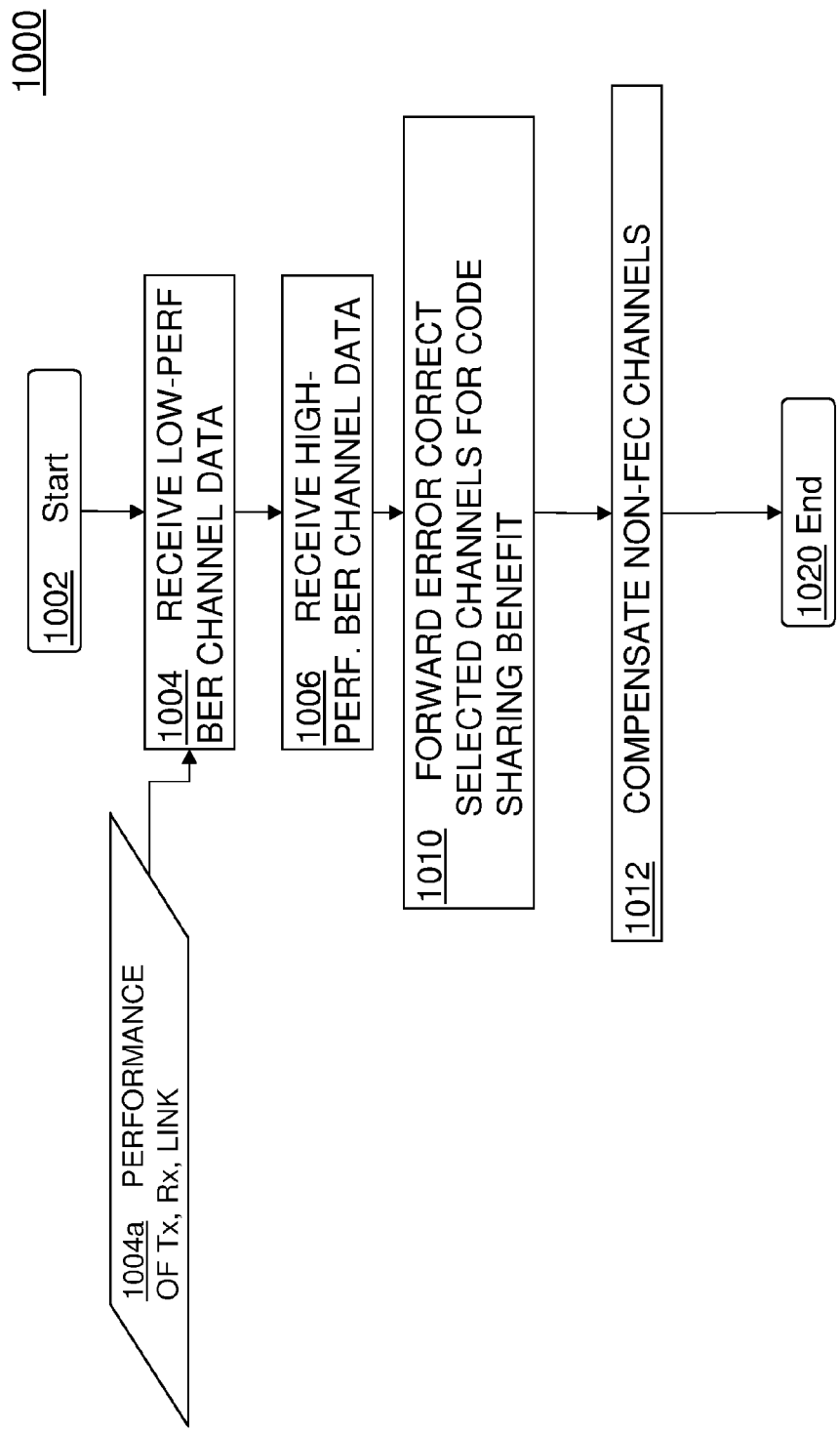
FIG. 8 is a flowchart of a process to establish FEC encoding to particular channels within a PIC, in accordance with one aspect of the present invention.

Referring now to FIG. 8 is a flowchart of a process to establish FEC encoding to particular channels within a PIC, in accordance with one aspect of the present invention. Flowchart 1000 can be applied with devices, systems, and data structures as shown in previous FIGS. 4-7.

In step 1004, low-performance BER channel data is received, while in step 1006 high-performance BER channel data is received. While the present embodiments implement hard-wired devices to compensate for known low BER channels with high-BER channels, the present invention is also well-suited to having a dynamic selection of high and low BER channels to be FEC encoded. Thus, while many of the optical performance tradeoffs in an integrated circuit are known aprioi to production and compensated with embodiments noted herein, other optical, system, and lifespan performance factors, e.g., degradation over time, traffic, detrimental environmental factors, that might be less deterministic and more intermittent. For these latter conditions, a programmable and selectable FEC code sharing system can be implemented, using cross-point switches, packet switching, etc. to allow selective FEC application to desired channels. Thus, this alternative embodiment can be implemented using BER monitoring at the receiver, processing by a local controller, and feedback to a transmitter as described in FIGS. 4A and 4B, and to selectively choose channels for FEC.

In step 1010, selected channels are forward error corrected, e.g., with the transmitter and receiver structures and methods described hereinabove. Encoding is performed on the selected data channels data channels, which could include any plurality of channels, from two to the entire population of channels. FEC encoding can include any error correcting code including, but not limited to, Reed-Solomon code, BCH code, Berlekamp Massy algorithm, or combinations of these codes as concatenated codes such as that taught in U.S. patent application Ser. No. 10/301,769 filed Nov. 20, 2002, which application is owned by the common assignee herein and is incorporated herein by its reference. While the structural embodiments described in previous figures provide specific, limited scope examples, the present invention is well-suited to alternative embodiments such as multiple joint-FEC encoders with different groupings of channels, e.g., lowest-performance BER channel N−1 FEC encoded with best-performance BER channel 1 through 3 for optimal code-sharing benefit, with nominal performance BER channel N−2 is FEC encoded with high-performance BER channel 4 for nominal code-sharing benefit, and finally with channel 5 might have sufficient BER performance to have a standalone FEC encoding protocol isolated to itself.

In step 1012, non-FEC channels are compensated for latency, data rate, etc. using techniques such as buffering and bit-stuffing. In this manner, the data channels are matched for optical signal generation and for transmission over fiber link. By using this method embodiment of the present invention, a wide range of implementations of FEC to selected channels will allow a designer to design around device non-linearities, and optical fabrication impairments that would other limit design scope of an integrate photonic circuit or otherwise substantially reduce production yield.

While the invention has been described in conjunction with several specific embodiments, it is evident to those skilled in the art that many further alternatives, modifications, and variations will be apparent in light of the foregoing description. Thus, the invention described herein is intended to embrace all such alternatives, modifications, applications and variations as may fall within the spirit and scope of the appended claims.

We claim:

1. A communication system comprising:
    an optical transmitter having a plurality of channels, a first one of the plurality of channels having a first error rate, and a second one of the plurality of channels having a second error rate; and
    a forward error correction (FEC) circuit coupled to the optical transmitter to compensate the first one of the plurality of channels by sharing a coding gain with the second one of the plurality of channels,
    wherein said sharing the coding gain includes successively generating first, second and third packets, said first and third packets being carried by the first one of the plurality of channels and said second packet being carried by the second one of the plurality of channels.

2. The communication system of claim 1 wherein each of the plurality of channels includes discrete active and passive elements.

3. The communication system of claim 1 wherein the optical transmitter is a photonic integrated circuit (PIC), each of the plurality of channels being provided on the PIC.

4. The communication system of claim 3 wherein each of the plurality of channels includes an active device coupled to a passive device.

5. The communication system of claim 1 further comprising a multiplexer coupled to the plurality of channels of the optical transmitter.

6. The communication system of claim 1 wherein the FEC circuit and the optical transmitter are integrated on a photonic integrated circuit.

7. The communication system of claim 1 wherein the FEC circuit and the optical transmitter are provided within a photonic integrated circuit.

8. The communication system of claim 1 wherein the first error rate is less than the second error rate.

9. A communication system comprising:
    an optical transmitter having a plurality of channels, wherein a first signal transmitted on a first of the plurality of channels has a first error rate and a second signal transmitted on a second of the plurality of channels has a second error rate;
    an optical receiver configured to receive the first and second signals from the optical transmitter;
    an optical link coupling the optical transmitter and the optical receiver;
    a first forward error correction circuit coupled to the optical transmitter; and
    a second forward error correction circuit coupled to the optical receiver, wherein a code gain realized at the receiver from the first channel is used to reduce the second error rate,
    wherein said realized code gain includes successively receiving first, second and third packets, said first and second packets being carried by the first channel and the second packet being carried by the second channel.

* * * * *